United States Patent
Mitsuoka et al.

(10) Patent No.: US 7,473,567 B2
(45) Date of Patent: Jan. 6, 2009

(54) CHANGE RATE PREDICTION METHOD, STORAGE MEDIUM, AND SUBSTRATE PROCESSING SYSTEM

(75) Inventors: Kazuyuki Mitsuoka, Nirasaki (JP); Yusuke Saito, Nirasaki (JP); Naoyuki Satoh, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 120 days.

(21) Appl. No.: 11/685,322

(22) Filed: Mar. 13, 2007

(65) Prior Publication Data
US 2007/0231459 A1 Oct. 4, 2007

Related U.S. Application Data

(60) Provisional application No. 60/790,565, filed on Apr. 10, 2006.

(30) Foreign Application Priority Data
Mar. 30, 2006 (JP) ............................. 2006-095633

(51) Int. Cl.
*H01L 21/66* (2006.01)
(52) U.S. Cl. ............................... 438/14; 438/5; 438/16; 438/17; 257/E21.521; 257/E21.53
(58) Field of Classification Search ........... 257/E21.529
See application file for complete search history.

(56) References Cited

U.S. PATENT DOCUMENTS 6,717,142 B2 * 4/2004 Hiroi et al. ................. 250/310

2002/0053634 A1 * 5/2002 Watanabe et al. .......... 250/201.2
2004/0137760 A1    7/2004 Onishi et al.

FOREIGN PATENT DOCUMENTS

JP          2000-511006        8/2000
WO         WO 98/43294        10/1998

* cited by examiner

*Primary Examiner*—Walter L Lindsay, Jr.
*Assistant Examiner*—Cheung Lee
(74) *Attorney, Agent, or Firm*—Oblon, Spivak, McClelland, Maier & Neustadt, P.C.

(57) ABSTRACT

A change rate prediction method according to which there can be eliminated the need for experimentally determining electron beam intensities for making a change rate of a specification value of a predetermined film on a substrate uniform. The distribution of the shrinkage rate of a low-k film on a wafer upon the low-k film being modified is measured while changing the inputted current value inputted to a central electron beam tube of an electron beam irradiating mechanism, the relationship between the inputted current value and the shrinkage rate measured directly below the electron beam tube is calculated, and a dose distribution calculated through simulation is converted into a low-k film shrinkage rate distribution based on the ratio between the inputted current value and the dose and a power curve giving the relationship between the inputted current value and the measured shrinkage rate.

10 Claims, 11 Drawing Sheets

CHANGE RATE PREDICTION METHOD, STORAGE MEDIUM, AND SUBSTRATE PROCESSING SYSTEM

This application claims benefit of application Ser. No. 60/790,565 filed Apr. 10, 2006.

BACKGROUND OF THE INVENTION

1. Field of the Invention

The present invention relates to a change rate prediction method, a storage medium, and a substrate processing system, and more particularly, to a method for predicting a change rate of a specification value of a film formed on a substrate, a storage medium in which is computer-readably stored a program for implementing the method, and a substrate processing system adapted to adjust intensities of electron beams irradiated onto the film based on measured values of the change rate of the specification value of the film.

2. Description of the Related Art

As the degree of integration of semiconductor devices has increased, wiring structures on substrates have become more minute. Reducing the parasitic capacitance caused by an insulating film between wires has thus become important. In recent years, various low-permittivity organic and inorganic materials for reducing the parasitic capacitance caused by an insulating film between wires have thus been developed. Of these materials, organic materials are used as low-k materials in interlayer insulating films, protective films and so on. Such a low-k film material is, for example, applied onto a surface of a substrate using a spin coater and then subjected to heat treatment using a baking oven, so as to form an SOD (spin-on dielectric) film as an interlayer insulating film. However, such an SOD film has a low mechanical strength due to being formed by applying a liquid material, and moreover due to the porosity being increased so as to secure low permittivity.

As a method of increasing the mechanical strength of an interlayer insulating film formed from a low-k film material, there is known a method in which a low-permittivity polymeric dielectric composition layer acting as an interlayer insulating film is exposed to electron beams so as to harden (modify, cure) the polymeric dielectric composition layer (see, for example, Published Japanese Translation of PCT Application No. 2000-511006).

A curing apparatus (substrate processing apparatus) for irradiating the interlayer insulating film with the electron beams so as to modify the interlayer insulating film has a plurality of electron beam tubes. The electron beam tubes are arranged uniformly in a horizontal plane directly above the substrate so that the interlayer insulating film on the substrate is irradiated uniformly with the electron beams from the electron beam tubes. Moreover, the curing apparatus has a stage having a heater built therein, the substrate which is mounted on the stage being heated by the heater. The low-k film material has the property of a thermosetting resin, and hence the interlayer insulating film can also be modified by the heating of the substrate.

Upon the interlayer insulating film being modified, the thickness of the interlayer insulating film decreases. Meanwhile, a plurality of semiconductor devices are formed on the substrate, and then cut out from respective places on the substrate. To eliminate individual differences between the semiconductor devices, it is necessary to make the shrinkage rate of the thickness of the interlayer insulating film on the substrate be uniform over the whole of the substrate.

However, the results of measuring the thickness of an interlayer insulating film modified by such a curing apparatus show that the shrinkage rate of the interlayer insulating film is not uniform over the substrate. For example, the shrinkage rate is high at a portion of the film directly below an electron beam tube, and is low at portions of the film in places away from the electron beam tube. The shrinkage rate of the interlayer insulating film is thus made uniform over the whole of the substrate by adjusting the intensities of the electron beams from the electron beam tubes in the curing apparatus. At this time, the intensities of the electron beams can be predicted to some extent by using commercially available simulation software that uses a Monte Carlo method or the like.

However, the electron beam intensities predicted using the commercially available simulation software are qualitatively accurate, but not quantitatively accurate. The shrinkage rate of the interlayer insulating film at each place on the substrate thus cannot be predicted quantitatively from the electron beam intensities predicted through the simulation, and hence it is difficult to make the shrinkage rate of the interlayer insulating film uniform over the whole of the substrate using such a simulation.

Instead of simulating the electron beam intensities, it is thus necessary to carry out experiments of modifying an interlayer insulating film on a substrate by irradiating the insulating film with the electron beams for several substrates while varying the electron beam intensities, and based on the experimental results, determine electron beam intensities that will enable the shrinkage rate of an interlayer insulating film on a substrate to be made uniform.

SUMMARY OF THE INVENTION

The present invention provides a change rate prediction method according to which there can be eliminated the need for experimentally determining electron beam intensities for making a change rate of a specification value of a predetermined film on a substrate uniform, a storage medium in which is computer-readably stored a program for implementing the method, and a substrate processing system adapted to adjust intensities of electron beams irradiated onto a film based on measured values of the change rate of the specification value of the film.

According to a first aspect of the present invention, there is provided a change rate prediction method of predicting a change rate of a specification value of a predetermined film formed on a substrate upon subjecting the predetermined film to electron beam irradiation and predetermined processing using a substrate processing apparatus that comprises a plurality of electron beam irradiating units each of which irradiates an electron beam onto the predetermined film and a processing unit that subjects the predetermined film to the predetermined processing, the method comprising a measurement step of carrying out, at each of a plurality of inputted current values, measurement of a change rate of the specification value of the predetermined film upon carrying out the electron beam irradiation onto the predetermined film from one of the electron beam irradiating units and the predetermined processing by the processing unit, while changing a current value inputted to the one of the electron beam irradiating units between the plurality of inputted current values, a first calculation step of calculating a relationship between the plurality of inputted current values and the measured change rate, a second calculation step of calculating through simulation an inputted current-related value for when the electron beams are irradiated from the plurality of electron beam irradiating units, and a conversion step of converting the inputted current-related value calculated in the second calculation step into a change rate of the specification value of the predetermined film based on the relationship calculated in the first calculation step.

According to the change rate prediction method of the first aspect of the present invention, the inputted current-related value for when the electron beams are irradiated from the plurality of electron beam irradiating units as calculated through simulation is converted into a change rate of the specification value of the predetermined film based on results of the calculation of the relationship between the inputted current value inputted to one of the electron beam irradiating units, this inputted current value being changed, and a measured value of the change rate of the specification value of the predetermined film. As a result, the change rate of the specification value of the predetermined film can be predicted quantitatively through the simulation, and hence the change rate of the specification value of the predetermined film can be made uniform by using the simulation. The need to experimentally determine electron beam intensities for making the change rate of the specification value of the predetermined film over a substrate uniform can thus be eliminated.

In the second calculation step, a distribution of the inputted current-related value over the substrate can be calculated through the simulation, and in the conversion step, the distribution of the inputted current-related value over the substrate calculated in the second calculation step can be converted into a distribution of the change rate of the specification value of the predetermined film over the substrate based on the relationship calculated in the first calculation step.

In this case, the distribution of the inputted current-related value over the substrate calculated through the simulation is converted into the distribution of the change rate of the specification value of the predetermined film over the substrate. As a result, the distribution of the change rate of the specification value of the predetermined film can be predicted quantitatively through the simulation, and hence the change rate can be made uniform.

The method can further comprise a third calculation step of, after the conversion, calculating a uniformity of the change rate of the specification value of the predetermined film over the predetermined film based on the distribution of the change rate of the specification value of the predetermined film over the predetermined film.

In this case, the uniformity of the change rate of the specification value of the predetermined film over the substrate is calculated based on the change rate of the specification value of the predetermined film obtained through the conversion. As a result, the change rate of the specification value of the predetermined film can be made uniform quickly.

The predetermined film can be an interlayer insulating film, the change rate of the specification value of the predetermined film can be a shrinkage rate of a thickness of the interlayer insulating film, and the inputted current-related value can be a dose on the substrate due to the electron beam irradiation.

In this case, the need to experimentally determine electron beam intensities for making the shrinkage rate of the thickness of an interlayer insulating film over a substrate uniform can thus be eliminated.

In the second calculation step, a distribution of the dose over the substrate can be calculated through the simulation, in the simulation, the dose due to the electron beam irradiated from each of the electron beam irradiating units can be calculated at each point on the substrate based on the current value inputted to that electron beam irradiating unit and the distance between that point on the substrate and that electron beam irradiating unit, and the distribution of the dose can further be calculated by calculating at each of the points on the substrate a total dose due to the irradiation of the electron beams from the electron beam irradiating units, and in the conversion step, the distribution of the dose over the substrate calculated in the second calculation step can be converted into a distribution of the shrinkage rate of the thickness over the interlayer insulating film based on the relationship calculated in the first calculation step.

In this case, the electron beam intensities for making the distribution of the shrinkage rate of the thickness of the interlayer insulating film over the substrate uniform can be obtained.

The processing unit can be a heater, and the predetermined processing can be heat treatment.

In this case, the processing unit is a heater, and the predetermined processing is heat treatment. Change in the specification value of the predetermined film is also promoted by such heat treatment, but through the conversion into the change rate of the specification value of the predetermined film based on the above relationship, the change rate of the specification value of the predetermined film can be accurately predicted quantitatively through the simulation.

According to a second aspect of the present invention, there is provided a computer-readable storage medium storing a program for causing a computer to implement a change rate prediction method of predicting a change rate of a specification value of a predetermined film formed on a substrate upon subjecting the predetermined film to electron beam irradiation and predetermined processing using a substrate processing apparatus that comprises a plurality of electron beam irradiating units each of which irradiates an electron beam onto the predetermined film and a processing unit that subjects the predetermined film to the predetermined processing, the method comprising a measurement step of carrying out, at each of a plurality of inputted current values, measurement of a change rate of the specification value of the predetermined film upon carrying out the electron beam irradiation onto the predetermined film from one of the electron beam irradiating units and the predetermined processing by the processing unit, while changing a current value inputted to the one of the electron beam irradiating units between the plurality of inputted current values, a first calculation step of calculating a relationship between the plurality of inputted current values and the measured change rate, a second calculation step of calculating through simulation an inputted current-related value for when the electron beams are irradiated from the plurality of electron beam irradiating units, and a conversion step of converting the inputted current-related value calculated in the second calculation step into a change rate of the specification value of the predetermined film based on the relationship calculated in the first calculation step.

According to the storage medium of the second aspect of the present invention, the same or similar advantages attained by the change rate prediction method according to the first aspect can be achieved.

According to a third aspect of the present invention, there is provided a substrate processing system comprising a substrate processing apparatus, having a plurality of electron beam irradiating units each of which irradiates an electron beam onto a predetermined film formed on a substrate and a processing unit adapted to subject the predetermined film to predetermined processing, and a controller adapted to control the substrate processing apparatus, wherein the controller calculates a relationship between a plurality of inputted current values and measured values obtained by carrying out, at each of the plurality of inputted current values, measurement of a change rate of a specification value of the predetermined film upon carrying out the electron beam irradiation onto the predetermined film from one of the electron beam irradiating units and the predetermined processing by the processing unit, while changing a current value inputted to the one of the electron beam irradiating units between the plurality of inputted current values, calculates through simulation an inputted current-related value for when the electron beams are irradiated from the plurality of electron beam irradiating units, and converts the inputted current-related value calculated through the simulation into a change rate of the specification value of the predetermined film based on the relationship.

According to the substrate processing system of the third aspect of the present invention, the same or similar advantages attained by the change rate prediction method according to the first aspect can be achieved.

The controller can adjust an intensity of the electron beam irradiated from each of the electron beam irradiating units based on the change rate of the specification value of the predetermined film obtained through the conversion.

In this case, the intensity of the electron beam irradiated from each of the electron beam irradiating units is adjusted based on the change rate of the specification value of the predetermined film obtained through the conversion. As a result, electron beam intensities for making the change rate of the specification value of the predetermined film over a substrate uniform can be found quickly, and hence the change rate of the specification value of the predetermined film can be made uniform quickly and easily.

The controller can calculate a uniformity of the change rate of the specification value of the predetermined film obtained through the conversion over the substrate based on the change rate, and can adjust an intensity of the electron beam irradiated from each of the electron beam irradiating units based on the calculated uniformity of the change rate.

In this case, the uniformity of the change rate of the specification value of the predetermined film obtained through the conversion over the substrate is calculated based on the change rate, and the intensity of the electron beam irradiated from each of the electron beam irradiating units is adjusted based on the calculated uniformity of the change rate. As a result, the electron beam intensities for making the change rate of the specification value of the predetermined film over a substrate uniform can be found yet more quickly, and hence the change rate of the specification value of the predetermined film can be made uniform yet more quickly and easily.

Further features of the present invention will become apparent from the following description of exemplary embodiment with reference to the attached drawings.

DETAILED DESCRIPTION OF THE PREFERRED EMBODIMENT

The present invention will now be described in detail below with reference to the drawings showing a preferred embodiment thereof.

Figure 1:
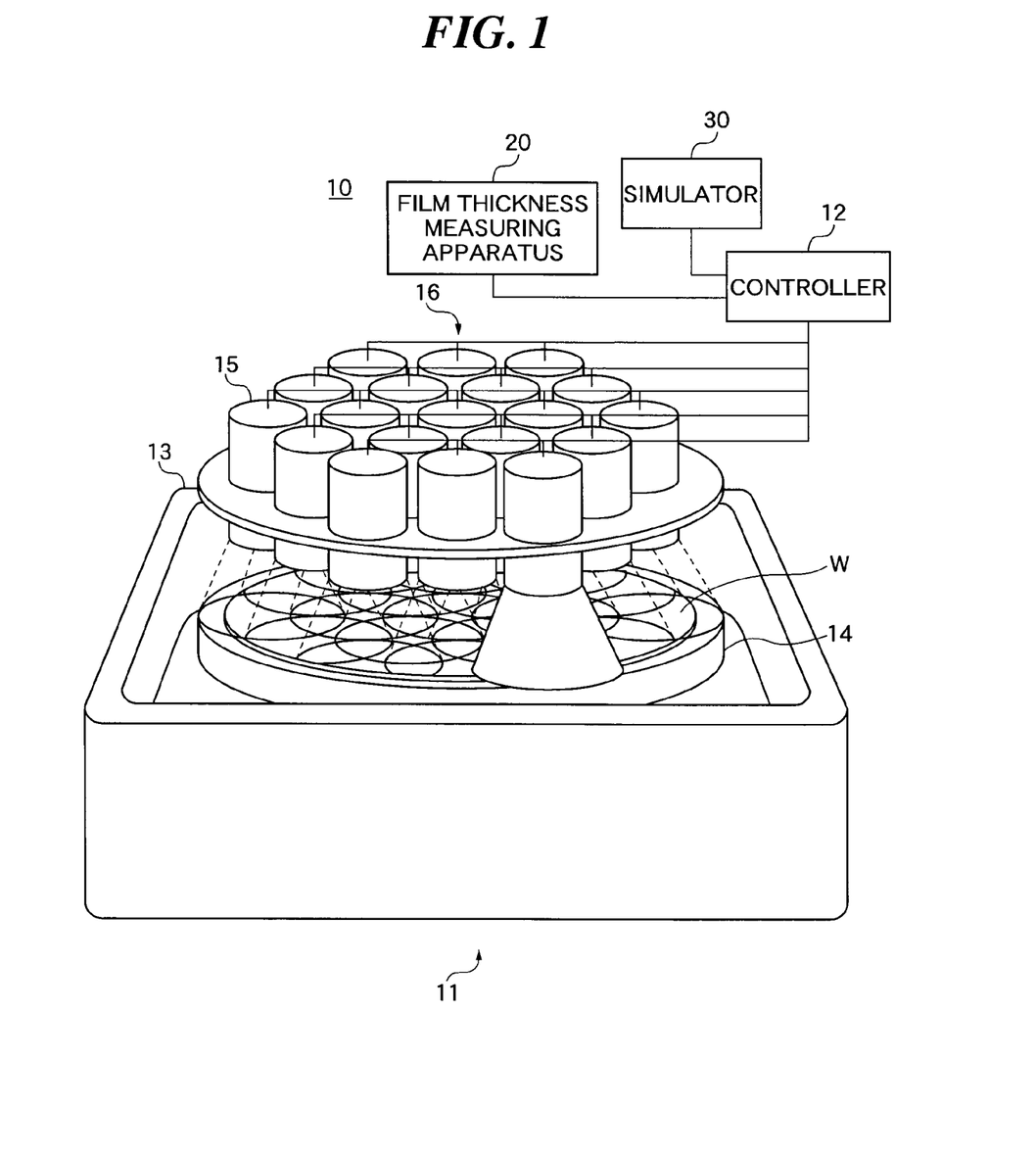
FIG. 1 is a perspective view schematically showing the construction of a substrate processing system according to an embodiment of the present invention in a state in which part of a curing apparatus of the system has been removed, a controller of the system being shown in a block.

FIG. 1 is a view schematically showing the construction of a substrate processing system according to an embodiment of the present invention in a state in which part of a curing apparatus of the system has been removed, a controller of the system being shown as a block.

As shown in FIG. 1, the substrate processing system 10 has a curing apparatus 11 and a controller 12 that controls the apparatus 11. The curing apparatus 11 irradiates an interlayer insulating film (e.g. a low-k film having $SiO_2$ and methyl groups as main constituents thereof (a predetermined film)) formed on a surface of a semiconductor wafer W for electronic devices (hereinafter referred to merely as the "wafer W") as a substrate with electron beams so as to modify the low-k film.

The curing apparatus 11 is comprised of a housing chamber 13 made, for example, of an aluminum material, constructed such as to be hermetically sealable to the outside, and adapted to accommodate the wafer W, a stage 14 provided inside the housing chamber 13 and substantially horizontally mounted with the wafer W in a state that the low-k film (designated by reference numeral 17 in FIG. 2) on the wafer W is directed upward, and an electron beam irradiating mechanism 16 provided in a ceiling portion of the housing chamber 13. The electron beam irradiating mechanism 16 irradiates the wafer W mounted on the stage 14 with electron beams. Note that in FIG. 1, of the ceiling portion of the housing chamber 13, only a portion in which the electron beam irradiating mechanism 16 is provided is shown, this portion being shown as a circular plate that extends parallel to a surface of the stage 14 on which the wafer is mounted above the stage 14; a portion around the periphery thereof is omitted from the drawing.

The electron beam irradiating mechanism 16 has a plurality of, for example nineteen, electron beam tubes 15 (electron beam irradiating units) held directly above the stage 14. Each of the electron beam tubes 15 is held such that a beam axis thereof is orthogonal to the surface of the stage 14 on which the wafer is mounted. The nineteen electron beam tubes 15 are arranged in concentric circles such as overall to cover a circular region of substantially the same shape as the wafer W mounted on the stage 14. Specifically, six electron beam tubes and twelve electron beam tubes are respectively arranged at equal angular intervals around two concentric circles centered on a central electron beam tube, whereby the nineteen electron beam tubes are arranged uniformly over the ceiling portion of the housing chamber 13 above the wafer W.

The electron beams irradiated from the electron beam irradiating mechanism 16 are electron streams that radiate out while repeatedly colliding with inert molecules and undergoing diffusion in a processing space inside the housing chamber 13; "electron beam" in the present embodiment means such an electron stream.

The stage 14 can be moved in a vertical direction so as to adjust the distance between the electron beam irradiating mechanism 16 and the wafer W when the wafer W is irradiated with the electron beams. Moreover, the stage 14 has a built-in heater (processing unit) that is disposed close to the surface of the stage 14 on which the wafer W is mounted. The heater heats the wafer W to a predetermined temperature so as to subject the low-k film to heat treatment (predetermined processing).

The controller 12 has a computer or the like, is connected to operational units of the curing apparatus 11 (e.g. the electron beam tubes 15 and the heater), and controls operation of the operational units (e.g. the intensity of the electron beam irradiated from each of the electron beam tubes 15, and the amount of heat radiated by the heater). The controller 12 is also connected to a film thickness measuring apparatus 20 that measures a thickness of the low-k film on the wafer W, the controller 12 calculating a shrinkage rate of the thickness of the low-k film (a change rate of a specification value of the predetermined film (a film thickness shrinkage rate)) based on the thickness of the low-k film measured by the film thickness measuring apparatus 20. That is, the substrate processing system 10 is able to measure the shrinkage rate of the low-k film.

Moreover, the controller 12 is also connected to a simulator 30. The simulator 30 is comprised of, for example, a computer, and calculates through simulation a dose (inputted current-related value) which is the amount of electrons injected in per unit area, this amount being correlated to the intensity of the electron beam irradiated onto the wafer W from one of the electron beam tubes 15.

Figure 2:
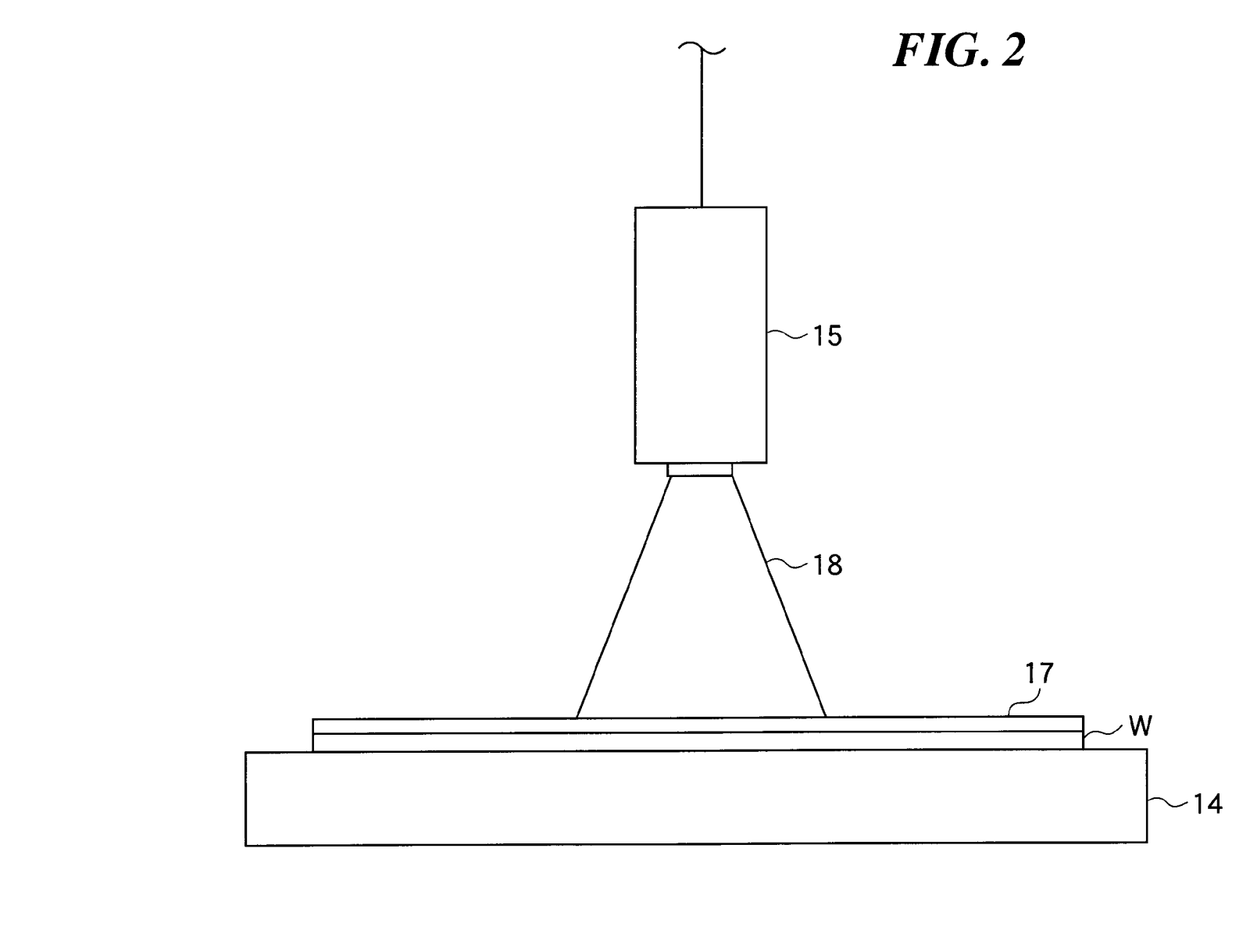
FIG. 2 is a view schematically showing irradiation of an electron beam onto a low-k film on a wafer from a central electron beam tube of the substrate processing system shown in FIG. 1.

When devising the present invention, the present inventors irradiated the low-k film 17 on a wafer W mounted on the stage 14 with an electron beam 18 from only the central electron beam tube 15 of the electron beam irradiating mechanism 16 as shown in FIG. 2 while heating the wafer W using the heater in the stage 14 so as to modify the low-k film 17, and measured the distribution over the wafer W of the shrinkage rate of the low-k film accompanying the modification (electron beam irradiation and heating).

Specifically, the distribution of the low-k film shrinkage rate was measured, with the value of the current inputted to the electron beam tube 15, which is closely related to the electron beam irradiation dose, being changed. That is, for example, while keeping the inputted current value constant, the low-k film shrinkage rate was measured at a plurality of points on the film, and the measured shrinkage rate was plotted on a graph against the distance from the center of the wafer W on the axis of abscissas so as to determine the distribution of the low-k film shrinkage rate over the whole of the wafer (see FIG. 3). This measurement of the shrinkage rate distribution was carried out for each of several inputted current values.

Figure 3:
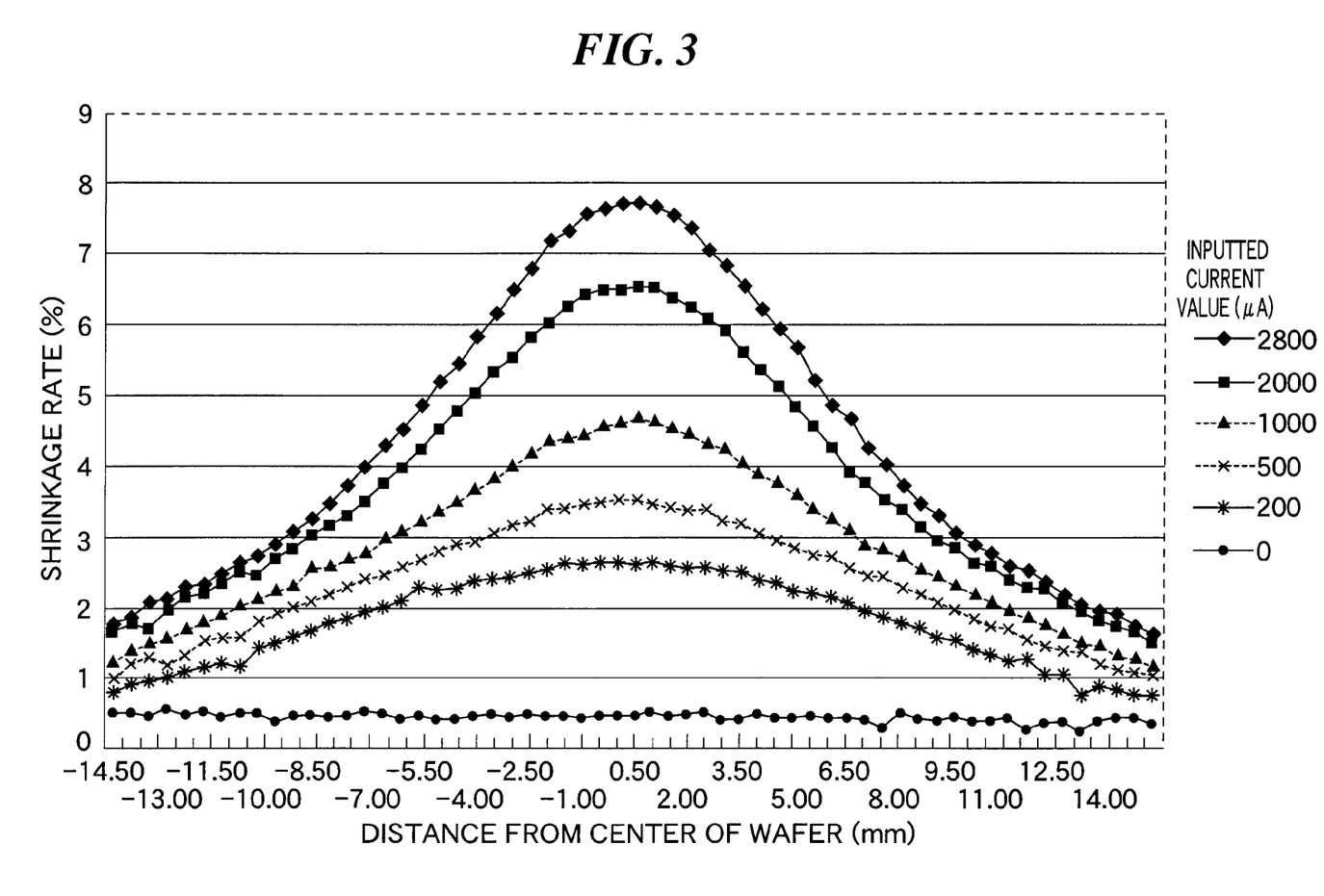
FIG. 3 is a graph showing a distribution of measured values of a shrinkage rate over a wafer for several values of a current inputted to the central electron beam tube.

In FIG. 3, the black diamonds, black squares, black triangles, crosses, stars, and black circles show respectively the shrinkage rates for inputted current values of 2800 µA, 2000 µA, 1000 µA, 500 µA, 200 µA, and 0 µA.

It was found that upon increasing the intensity of the electron beam 18 irradiated from the central electron beam tube 15 by increasing the inputted current value, as shown by the graph in FIG. 3, the overall shrinkage rate of the low-k film increases as the inputted current value increases, and in particular the shrinkage rate at the center of the wafer W, which is directly below the central electron beam tube 15, increases markedly. That is, it was found that the shrinkage rate varies not only with the inputted current value, but also with the measurement site on the wafer. Moreover, it was found that even when the inputted current value is 0 µA, the shrinkage rate is not zero, but rather the low-k film does shrink. This is thought to be due to the heating from the heater.

Figure 4:
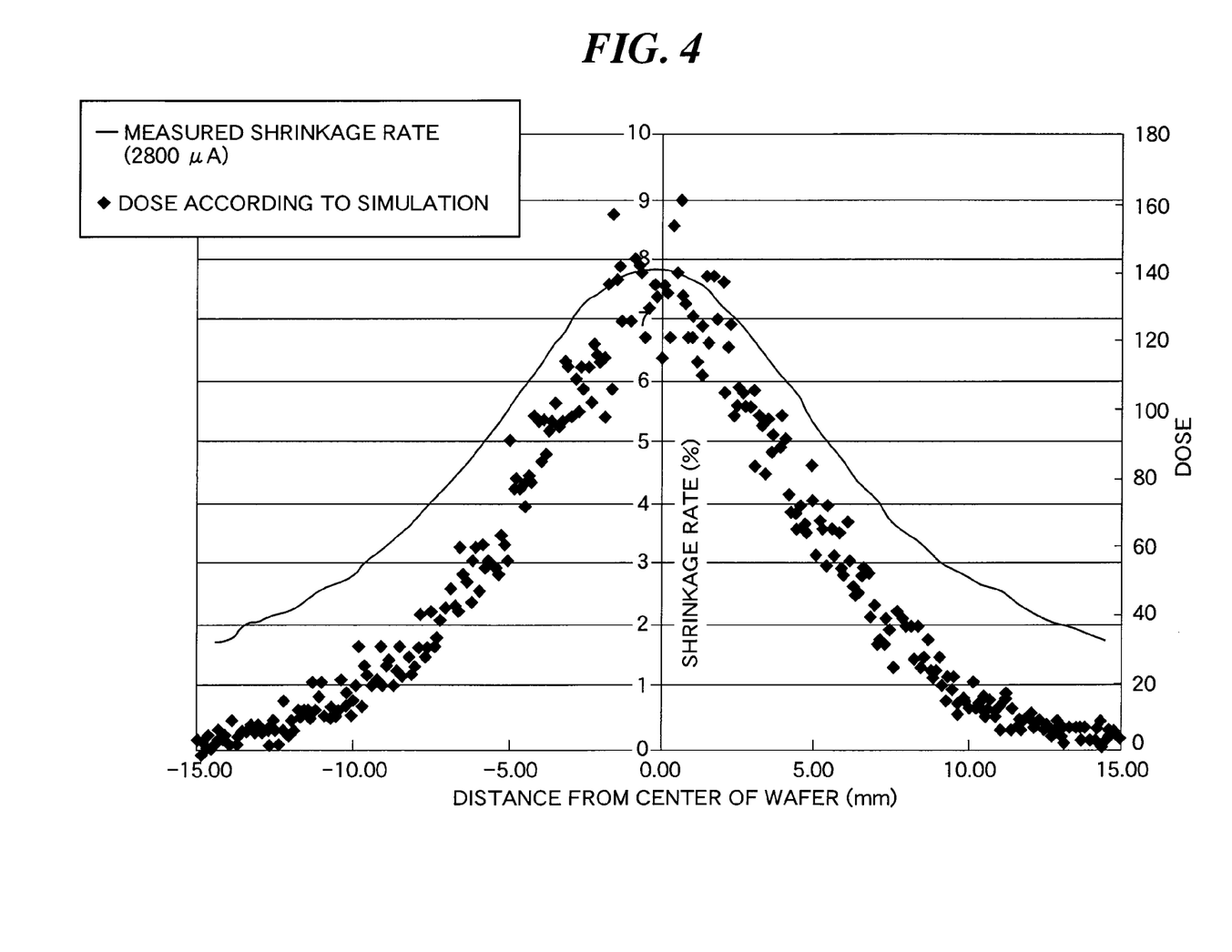
FIG. 4 is a graph on which a dose distribution calculated through simulation is plotted as black diamonds, and the shrinkage rate measured at an inputted current value of 2800 µA is plotted as a full line.

Next, the present inventors calculated through simulation the distribution of the dose over the wafer W irradiated with the electron beam from one of the electron beam tubes 15 (here, the central electron beam tube 15) upon driving the electron beam tube 15 at an inputted current value of 2800 µA. That is, the dose at each site on the wafer was calculated through simulation, and as shown by the black diamonds on the graph in FIG. 4, the calculated dose was plotted on a graph against the distance from the center of the wafer W on the axis of abscissas, thereby determining the distribution of the dose over the wafer W. The distribution of the shrinkage rate measured when driving the electron beam tube at an inputted current value of 2800 µA is also shown as a curve (the full line in FIG. 4) together with the above dose distribution. As shown by the graph in FIG. 4, it was found that the dose distribution calculated through the simulation is shifted from the measured shrinkage rate distribution.

With an aim of eliminating the shift between the dose distribution over the wafer and the low-k film shrinkage rate distribution over the wafer, the present inventors thus focused on the relationship between the dose and the shrinkage rate. Specifically, the present inventors focused on the relationship between the value of the current inputted to an electron beam tube, which is closely related to the electron beam irradiation dose, and the low-k film shrinkage rate. That is, the relationship between the value of the current inputted to the central electron beam tube (more generally, one of the electron beam tubes) and the maximum low-k film shrinkage rate measured at the center of the wafer W (directly below the central electron beam tube 15) was obtained from the graph in FIG. 3.

Figure 5:
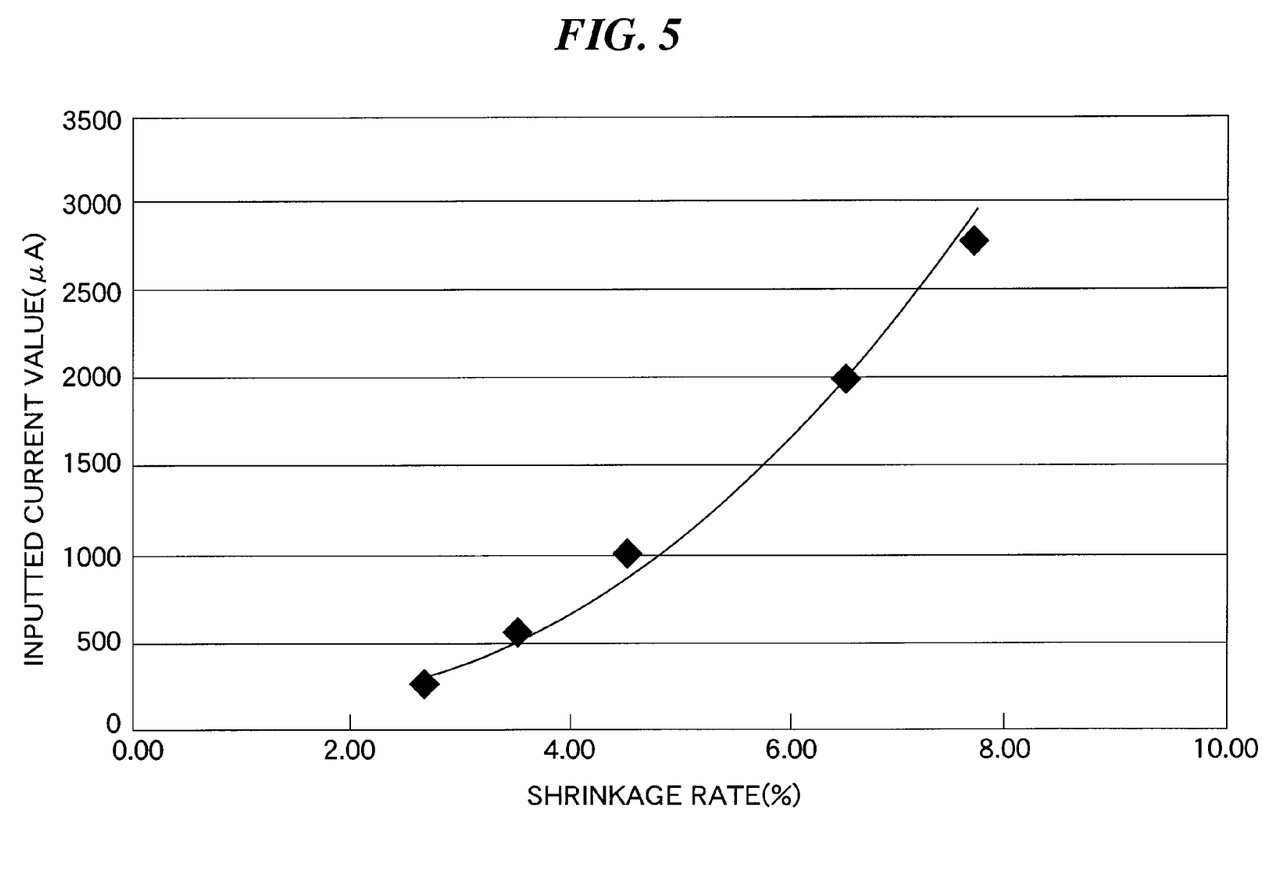
FIG. 5 is a graph showing the relationship between the measured shrinkage rate and the inputted current value.

FIG. 5 is a graph showing the relationship between the value of the current inputted to the one electron beam tube and the maximum measured low-k film shrinkage rate.

From the graph shown in FIG. 5, taking the inputted current value to be "y" and the shrinkage rate to be "x", it was found that the relationship between the inputted current value and the maximum measured shrinkage rate is given approximately by a curve, for example the power curve given by following formula (1).

$$y = 20.898 x^{2.4332} \qquad (1)$$

Note that it is thought that the relationship between the inputted current value and the measured shrinkage rate is not linear because of the effect of the heat treatment by the heater. Furthermore, the relationship between the value of the current inputted to the electron beam tube and the measured low-k film shrinkage rate varies depending on the specifications of the electron beam tube and so on, and hence the power curve giving this relationship is not limited to being the power curve given by formula (1) above.

As described above, the graph in FIG. 5 shows the relationship between the value of the current inputted to one of the electron beam tubes 15, for example the central electron beam tube 15, and the measured low-k film shrinkage rate directly below that electron beam tube 15 (the maximum shrinkage rate), this relationship being given by an approximate curve, for example a power curve. Note that the electron beam tube 15 used in the measurement of the shrinkage rate is not limited to being the central electron beam tube 15, but rather may instead be another one of the electron beam tubes. Moreover, the relationship between the inputted current value inputted to each of the nineteen electron beam tubes 15 of the electron beam irradiating mechanism 16 and the average value of the low-k film shrinkage rates measured at a plurality of measurement points on the wafer W may also be represented by an approximate curve, for example a power curve.

Figure 6:
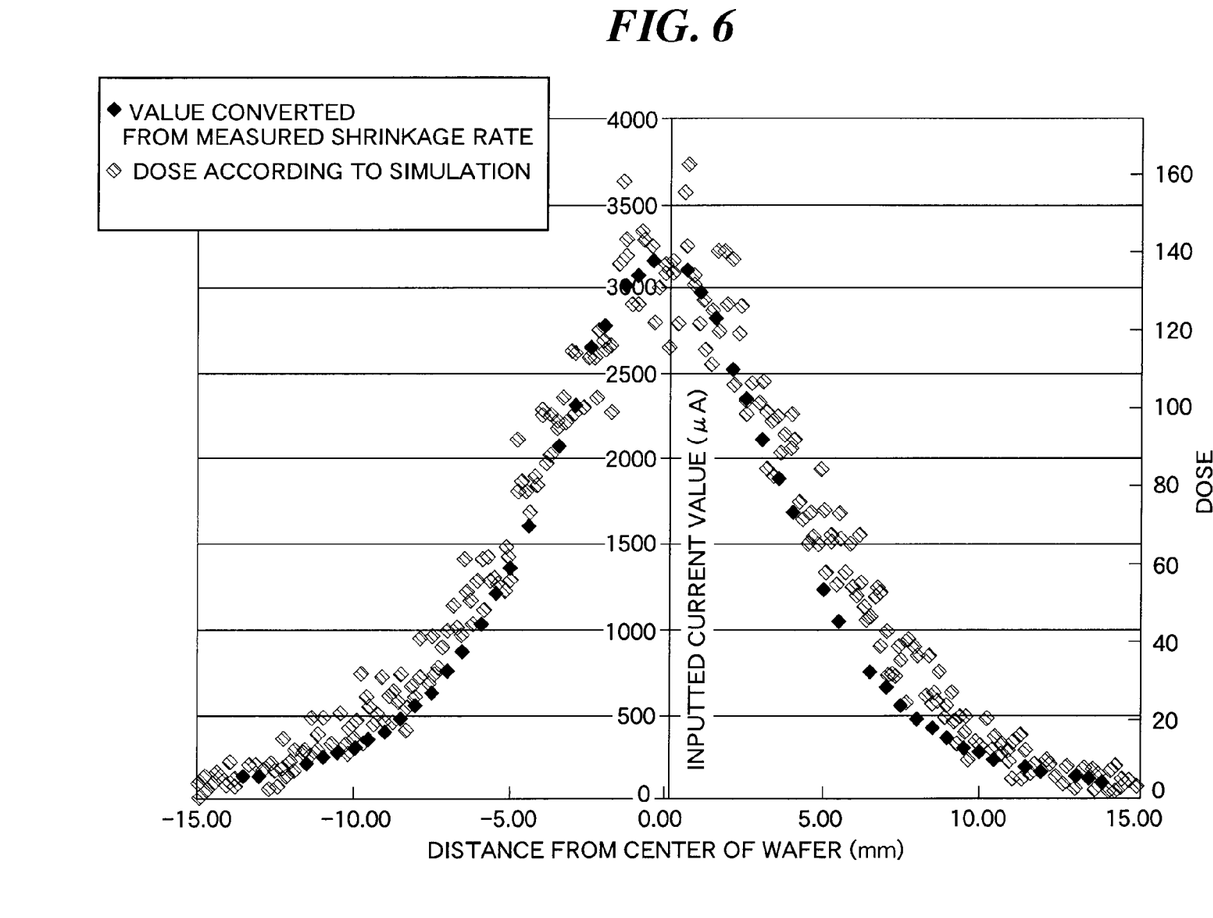
FIG. 6 is a graph showing as gray diamonds an inputted current value distribution obtained by converting the measured shrinkage rate distribution using the relationship shown in FIG. 5, and showing as black diamonds a dose distribution calculated through simulation.

Next, based on the relationship between the inputted current value and the measured shrinkage rate obtained as described above (formula (1)), the low-k film shrinkage rates measured when irradiating with an electron beam with an inputted current value of 2800 µA were converted into inputted current values, whereupon as shown by the graph in FIG. 6, it was found that the distribution over the wafer of the inputted current value obtained through the conversion (shown by the gray diamonds) and the distribution over the wafer of the dose calculated through the simulation (shown by the black diamonds) substantially matched one another. It was thus found that, based on the relationship between the inputted current value and the measured shrinkage rate, the distribution of the shrinkage rate actually arising can be predicted from the distribution of the dose calculated through simulation.

Next, a low-k film shrinkage rate prediction method which is a change rate prediction method according to the present embodiment will be described. The shrinkage rate prediction method is based on the knowledge obtained by the present inventors as described above.

Figure 7:
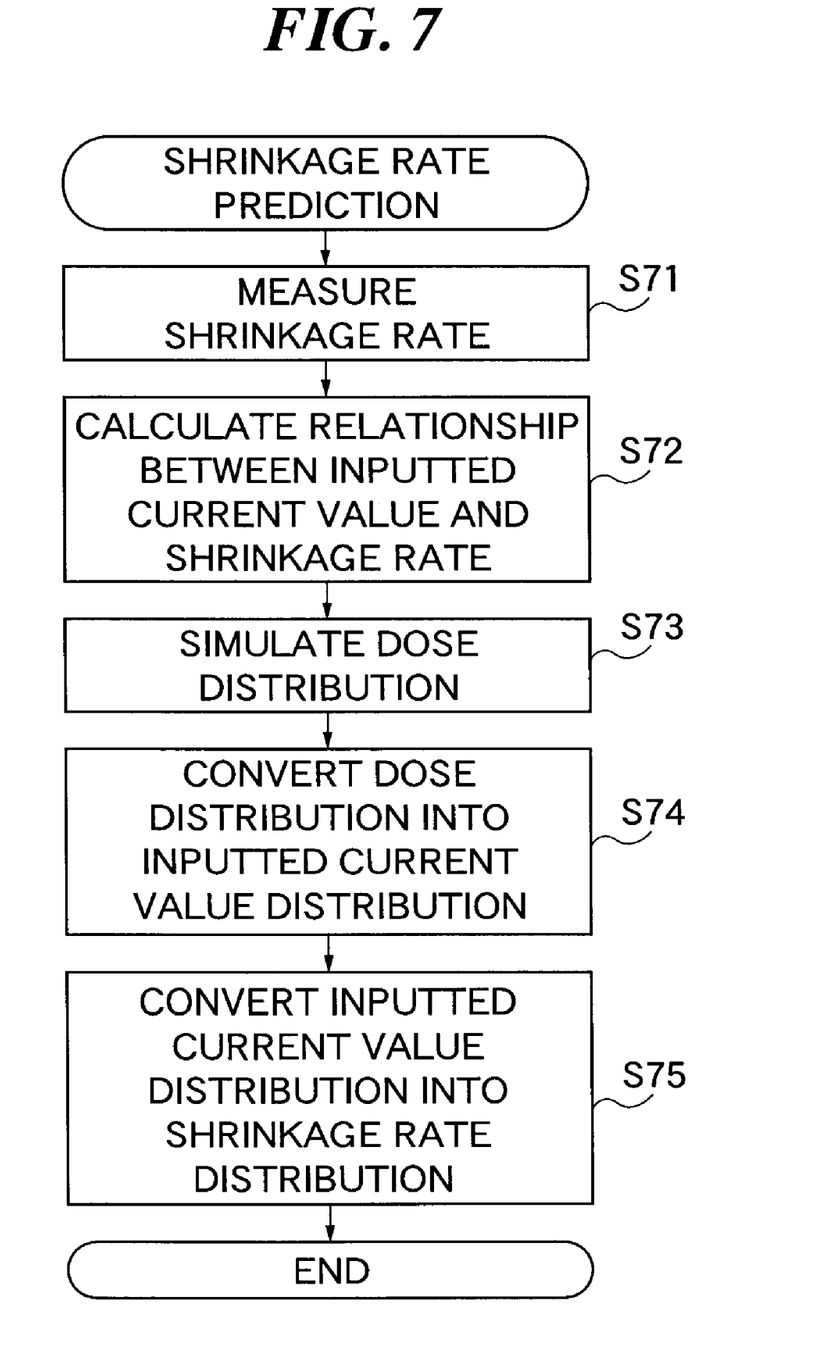
FIG. 7 is a flowchart of a low-k film shrinkage rate prediction method which is a change rate prediction method according to the above embodiment.

FIG. 7 is a flowchart of the low-k film shrinkage rate prediction method as the change rate prediction method according to the present embodiment.

As shown in FIG. 7, first, with the value of the current inputted to one of the electron beam tubes 15 (e.g. the central electron beam tube 15) of the electron beam irradiating mechanism 16 being changed, the low-k film on a wafer W is irradiated with an electron beam from only that electron beam tube 15 and the wafer W is heated by the heater in the stage 14 so as to modify the low-k film, and the low-k film shrinkage rate distribution over the wafer at this time is measured, the measurement being carried out for each of a plurality of inputted current values (step S71) (measurement step).

Next, a power curve representing the relationship between the inputted current value and the shrinkage rate measured directly below (here, in the center of the wafer W) the one of the electron beam tubes 15 (here, the central electron beam tube 15) is calculated (first calculation step) (step S72). This power curve is calculated based on each inputted current value inputted into the one of the electron beam tubes 15 and the measured shrinkage rate directly below the one of the electron beam tubes 15 at that inputted current value, the inputted current value being changed. Alternatively, the power curve may be calculated based on the inputted current value inputted into a chosen one of the electron beam tubes 15 of the electron beam irradiating mechanism 16 and the average value of the low-k film shrinkage rates measured over a plurality of points on the wafer W at that inputted current value.

Figure 8:
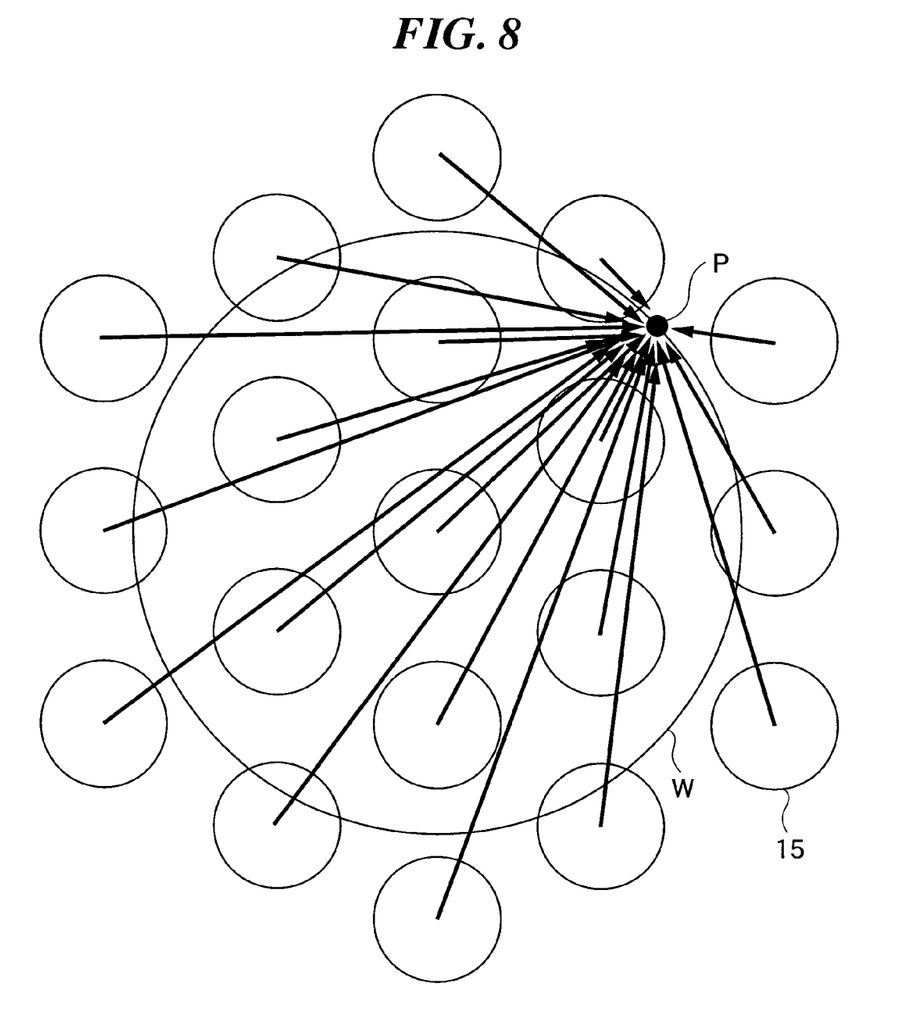
FIG. 8 is a view showing a method of calculating a total dose at a point on a wafer.

Next, the distribution of the dose due to the electron beams irradiated onto the wafer W from the nineteen electron beam tubes 15 is calculated through simulation (second calculation step) (step S73). Specifically, as shown in FIG. 8, the distance to a point P on the wafer W from each of the electron beam tubes 15 is calculated, and the dose due to the electron beam irradiated from each electron beam tube 15 is calculated based on the calculated distance and the inputted current value, and then the total dose due to the irradiation of the electron beams from the nineteen electron beam tubes 15 is further calculated. The distribution of the dose over the wafer is then calculated by calculating this total dose at each point on the wafer W.

Next, the calculated dose distribution is converted into an inputted current value distribution (step S74). The conversion is carried out using, for example, the ratio between the inputted current value scale and the dose scale on the graph in FIG. 6 as a conversion factor. Furthermore, the inputted current value distribution obtained through the conversion from the dose distribution is converted into a low-k film shrinkage rate distribution based on the power curve giving the relationship between the inputted current value and the measured shrinkage rate calculated as described above (step S75) (conversion step), whereupon the present process comes to an end.

As described above, according to the process of FIG. 7, a power curve giving the relationship between a plurality of values of the changing current inputted to the electron beam tube 15 and the measured values of the shrinkage rate at the plurality of inputted current values is calculated for the case of irradiating the low-k film with an electron beam from one of the electron beam tubes 15 and at the same time subjecting the low-k film to heat treatment by the heater, and then the dose distribution for when electron beams are irradiated from the nineteen electron beam tubes 15 as calculated through simulation is converted into an inputted current value distribution using a conversion factor (the ratio between the inputted current value and the dose), and the inputted current value distribution obtained through the conversion is converted into a low-k film shrinkage rate distribution based on the calculated power curve. As a result, the low-k film shrinkage rate can be predicted quantitatively through simulation, and hence the low-k film shrinkage rate can be made uniform by using the simulation. The need to experimentally determine the electron beam intensities for making the shrinkage rate over the wafer W uniform can thus be eliminated.

Moreover, in the substrate processing system 10, the controller 12 may calculate the uniformity of the low-k film shrinkage rate over the wafer W based on the low-k film shrinkage rate distribution obtained through the conversion. As a result, the shrinkage rate can be made uniform quickly. Furthermore, the controller 12 may adjust the intensities of the electron beams irradiated from the electron beam tubes 15 based on the calculated uniformity of the low-k film shrinkage rate. As a result, electron beam intensities for making the low-k film shrinkage rate uniform over the wafer W can be found quickly, and hence the low-k film shrinkage rate can be made uniform quickly and easily.

Figure 9:
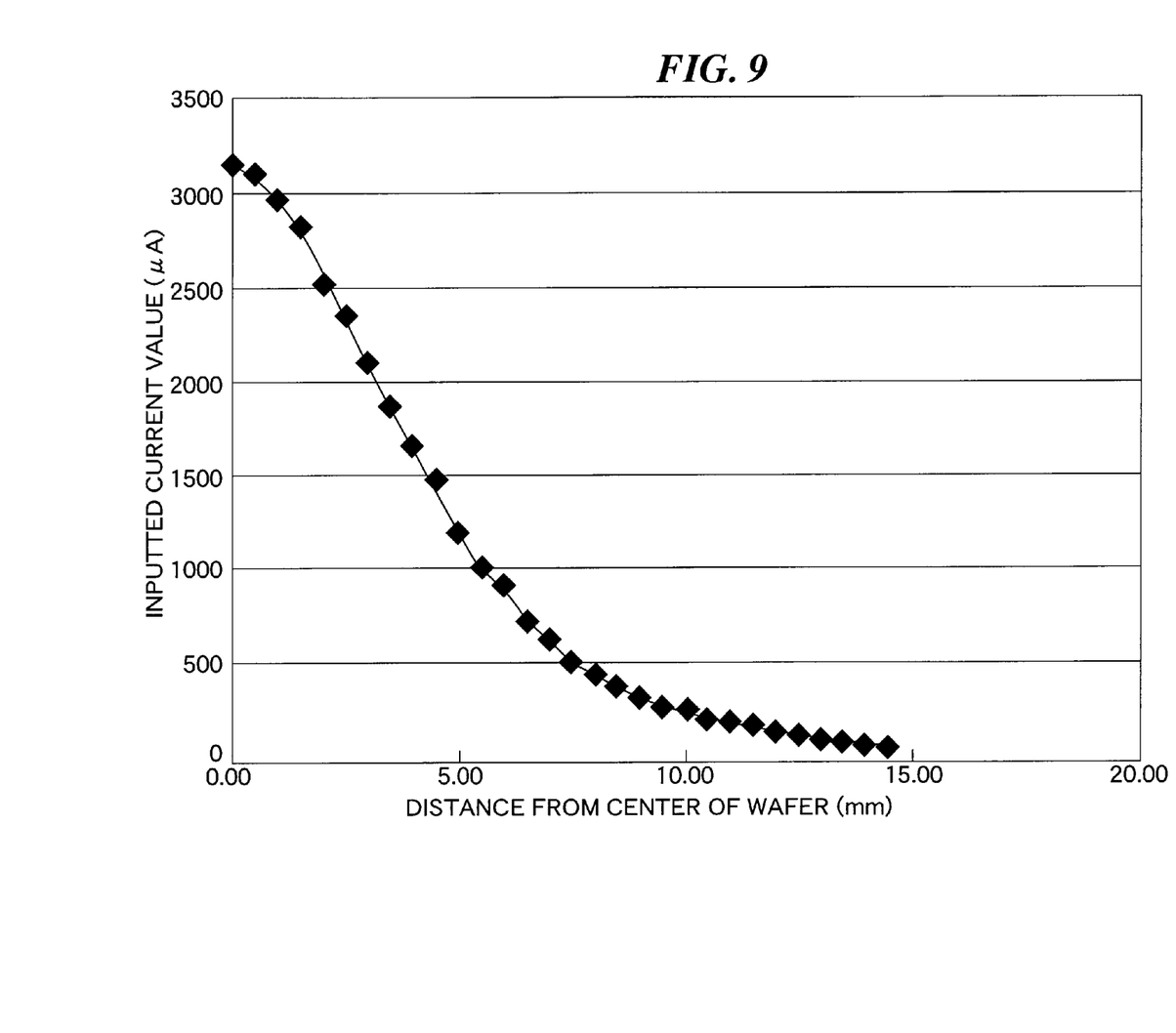
FIG. 9 is a graph showing the relationship between the distance from the center of a wafer and the inputted current value.

In the process of FIG. 7 described above, the total dose due to the electron beam irradiation from the nineteen electron beam tubes 15 is determined at each point on the wafer in advance, and the dose distribution based on respective total doses is converted into the inputted current value distribution. However, alternatively, it may be that the dose distribution due to the electron beam irradiated from each of the electron beam tubes 15 (the relationship between the dose and the distance from the center of the wafer W (or from directly below the electron beam tube 15) is converted into the relationship between the inputted current value and the distance from the center of the wafer W (FIG. 9) using the ratio between the inputted current value scale and the dose scale on the graph in FIG. 6 (the conversion factor), and then the total inputted current value at each point on the wafer W is calculated, whereby the inputted current value distribution over the wafer W is calculated.

Moreover, the process of FIG. 7 described above can also be applied to a substrate processing system having a curing apparatus having an electron beam irradiating mechanism comprised of electron beam tubes having different specifications from one another. Note, however, that in this case, a power curve giving the relationship between the inputted current value and the measured shrinkage rate must be calculated separately for each of the electron beam tubes having different specifications.

Furthermore, the process of FIG. 7 can also be used for calculating the low-k film shrinkage rate distribution over a wafer in the case that an electron beam tube 15 of the electron beam irradiating mechanism 16 other than the electron beam tube 15 used in the shrinkage rate measurement has failed. In this case, an electron beam is not irradiated from the failed electron beam tube 15, and hence when calculating the total dose at each point on the wafer W, the dose due to the electron beam that would normally be irradiated from the failed electron beam tube 15 is not added in.

Figure 10:
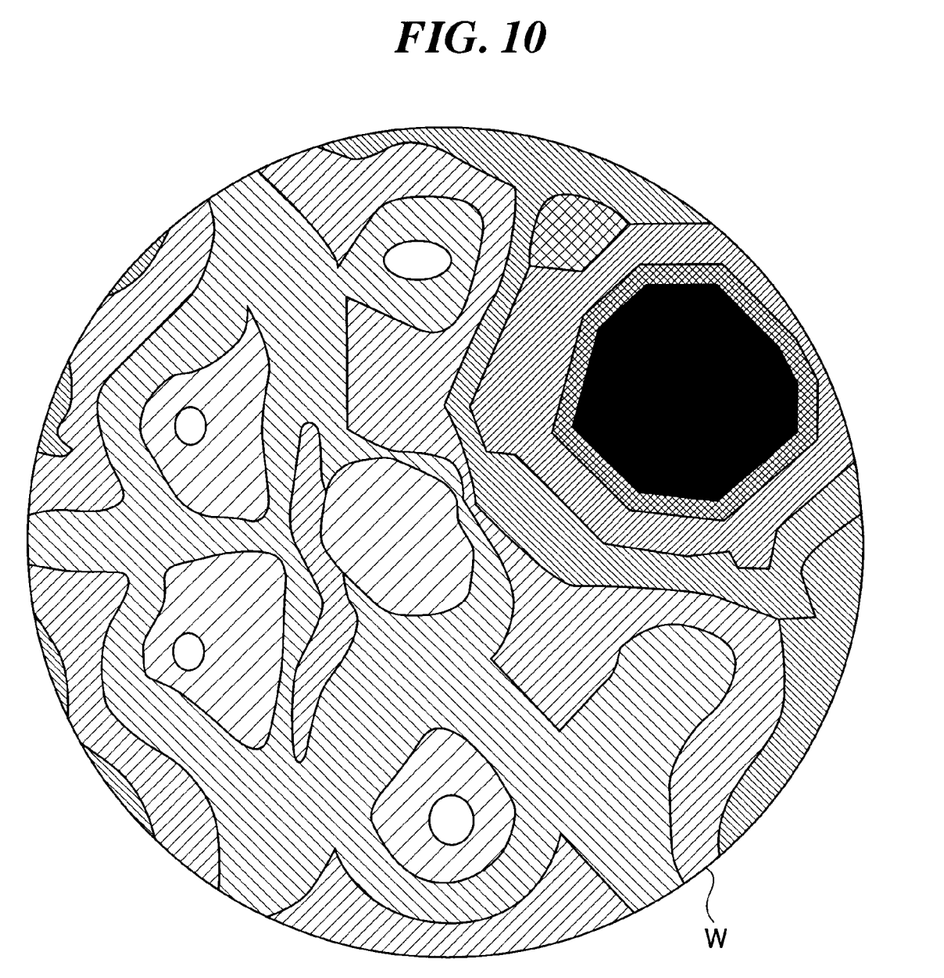
FIG. 10 is a view showing the low-k film shrinkage rate distribution over a wafer calculated through simulation for the case that one electron beam tube has failed.

FIG. 10 shows results of calculation through simulation of the low-k film shrinkage rate distribution for the case that an electron beam tube 15 disposed facing the black wafer region shown in the upper right of FIG. 10 has failed. In FIG. 10, the closer the color in a region is to white, the greater the shrinkage rate, whereas the closer the color in a region is to black, the lower the shrinkage rate.

The substrates on which a low-k film is modified using the substrate processing system 10 described above are not limited to being semiconductor wafers for electronic devices, but rather may instead be any of various substrates used in LCDs (liquid crystal displays), FPDs (flat panel displays) or the like, photomasks, CD substrates, printed circuit substrates, or the like.

It is to be understood that the object of the present invention can also be attained by supplying to the controller 12 a storage medium in which a program code of software that realizes the functions of the embodiment described above is stored, and then causing a computer (or CPU, MPU, or the like) of the controller 12 to read out and execute the program code stored in the storage medium.

In this case, the program code itself read out from the storage medium realizes the functions of the embodiment described above, and hence the program code and the storage medium in which the program code is stored constitute the present invention.

The storage medium for supplying the program code may be, for example, a floppy® disk, a hard disk, a magnetic-optical disk, an optical disk such as a CD-ROM, a CD-R, a CD-RW, a DVD-ROM, a DVD-RAM, a DVD-RW or a DVD+RW, a magnetic tape, a non-volatile memory card, or a ROM. Alternatively, the program code may be downloaded via a network.

Moreover, it is to be understood that the functions of the embodiment described above may be accomplished not only by executing a program code read out by a computer, but also by causing an OS (operating system) or the like which operates on the computer to perform a part or all of the actual operations based on instructions of the program code.

Furthermore, it is to be understood that the functions of the embodiment described above may be accomplished by writing a program code read out from the storage medium into a memory provided on an expansion board inserted into a computer or in an expansion unit connected to the computer and then causing a CPU or the like provided on the expansion board or in the expansion unit to perform a part or all of the actual operations based on instructions of the program code.

The form of the program code may be, for example, object code, program code executed by an interpreter, or script data supplied to an OS.

WORKING EXAMPLE

Next, a working example of the present invention will be described in detail.

Figure 11A:
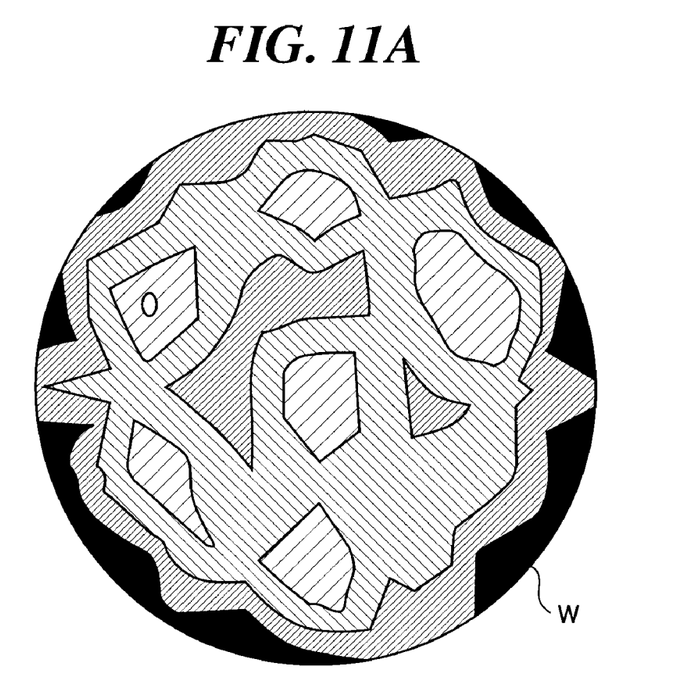
FIG. 11A is a view showing the distribution of the measured shrinkage rate of a low-k film on a wafer upon the low-k film being modified.

First, using the substrate processing system 10 described above, a wafer W was mounted on the stage 14, and electron beams were irradiated from the nineteen electron beam tubes 15 of the electron beam irradiating mechanism 16 toward the low-k film 17 on the wafer W and moreover the wafer W was heated by the heater in the stage 14, so as to modify the low-k film, and the low-k film shrinkage rate distribution at this time was measured. FIG. 11A shows the distribution of the measured shrinkage rate of the low-k film on the wafer upon the low-k film being modified. In FIG. 11A, the closer the color in a region is to white, the greater the shrinkage rate, whereas the closer the color in a region is to black, the lower the shrinkage rate.

Figure 11B:
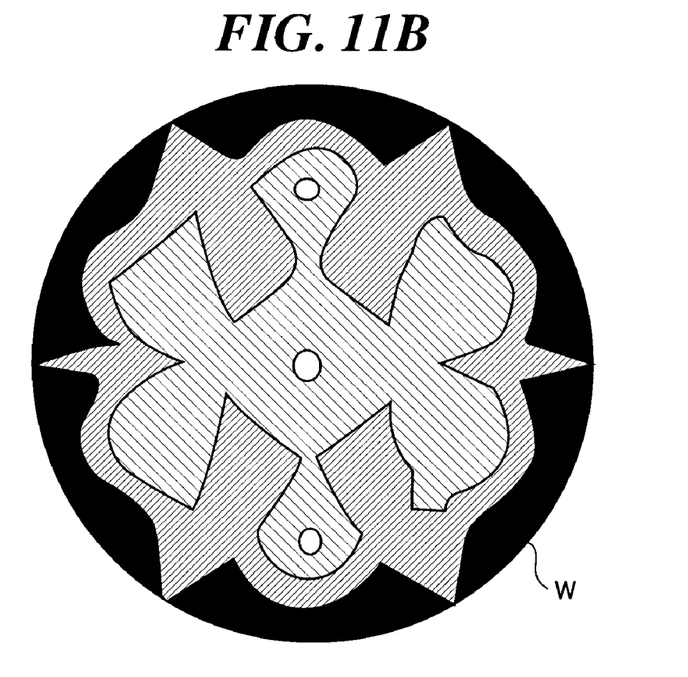
FIG. 11B is a view showing the distribution over the wafer of the shrinkage rate calculated through simulation by implementing the process shown in FIG. 7.

Moreover, using the substrate processing system 10 described above, the process of FIG. 7 described above was implemented, so as to calculate the low-k film shrinkage rate distribution based on doses calculated through simulation. FIG. 11B shows the shrinkage rate distribution obtained based on the simulation. In FIG. 11B, the closer the color in a region is to white, the greater the shrinkage rate, whereas the closer the color in a region is to black, the lower the shrinkage rate.

As a result of comparing the measured shrinkage rate distribution shown in FIG. 11A and the shrinkage rate distribution based on the simulation shown in FIG. 11B, it was found that the measured shrinkage rate distribution and the shrinkage rate distribution calculated through the simulation substantially match one another. That is, it was found that the low-k film shrinkage rate can be predicted quantitatively by converting the dose distribution due to the electron beams from the plurality of electron beam tubes 15 as calculated through simulation into the shrinkage rate distribution based on the relationship between the inputted current value and the measured shrinkage rate.

What is claimed is:

1. A change rate prediction method of predicting a change rate of a specification value of a predetermined film formed on a substrate upon subjecting the predetermined film to electron beam irradiation and predetermined processing using a substrate processing apparatus that comprises a plurality of electron beam irradiating units each of which irradiates an electron beam onto the predetermined film and a processing unit that subjects the predetermined film to the predetermined processing, the method comprising:

a measurement step of carrying out, at each of a plurality of inputted current values, measurement of a change rate of the specification value of the predetermined film upon carrying out the electron beam irradiation onto the predetermined film from one of the electron beam irradiating units and the predetermined processing by the processing unit, while changing a current value inputted to the one of the electron beam irradiating units between the plurality of inputted current values;

a first calculation step of calculating a relationship between the plurality of inputted current values and the measured change rate;

a second calculation step of calculating through simulation an inputted current-related value for when the electron beams are irradiated from the plurality of electron beam irradiating units; and a conversion step of converting the inputted current-related value calculated in said second calculation step into a change rate of the specification value of the predetermined film based on the relationship calculated in said first calculation step.

2. A method as claimed in claim 1, wherein in said second calculation step, a distribution of the inputted current-related value over the substrate is calculated through the simulation, and in said conversion step, the distribution of the inputted current-related value over the substrate calculated in said second calculation step is converted into a distribution of the change rate of the specification value of the predetermined film over the substrate based on the relationship calculated in said first calculation step.

3. A method as claimed in claim 2, further comprising:

a third calculation step of, after the conversion, calculating a uniformity of the change rate of the specification value of the predetermined film over the predetermined film based on the distribution of the change rate of the specification value of the predetermined film over the predetermined film.

4. A method as claimed in claim 1, wherein the predetermined film is an interlayer insulating film, the change rate of the specification value of the predetermined film is a shrinkage rate of a thickness of the interlayer insulating film, and the inputted current-related value is a dose on the substrate due to the electron beam irradiation.

5. A method as claimed in claim 4, wherein in said second calculation step, a distribution of the dose over the substrate is calculated through the simulation, in the simulation, the dose due to the electron beam irradiated from each of the electron beam irradiating units is calculated at each point on the substrate based on the current value inputted to that electron beam irradiating unit and the distance between that point on the substrate and that electron beam irradiating unit, and the distribution of the dose is further calculated by calculating at each of the points on the substrate a total dose due to the irradiation of the electron beams from the electron beam irradiating units, and in said conversion step, the distribution of the dose over the substrate calculated in said second calculation step is converted into a distribution of the shrinkage rate of the thickness over the interlayer insulating film based on the relationship calculated in said first calculation step.

6. A method as claimed in claim 1, wherein the processing unit is a heater, and the predetermined processing is heat treatment.

7. A computer-readable storage medium storing a program for causing a computer to implement a change rate prediction method of predicting a change rate of a specification value of a predetermined film formed on a substrate upon subjecting the predetermined film to electron beam irradiation and predetermined processing using a substrate processing apparatus that comprises a plurality of electron beam irradiating units each of which irradiates an electron beam onto the predetermined film and a processing unit that subjects the predetermined film to the predetermined processing, the method comprising:

a measurement step of carrying out, at each of a plurality of inputted current values, measurement of a change rate of the specification value of the predetermined film upon carrying out the electron beam irradiation onto the predetermined film from one of the electron beam irradiating units and the predetermined processing by the processing unit, while changing a current value inputted to the one of the electron beam irradiating units between the plurality of inputted current values;

a first calculation step of calculating a relationship between the plurality of inputted current values and the measured change rate;

a second calculation step of calculating through simulation an inputted current-related value for when the electron beams are irradiated from the plurality of electron beam irradiating units; and a conversion step of converting the inputted current-related value calculated in said second calculation step into a change rate of the specification value of the predetermined film based on the relationship calculated in said first calculation step.

8. A substrate processing system comprising:

a substrate processing apparatus having a plurality of electron beam irradiating units each of which irradiates an electron beam onto a predetermined film formed on a substrate, and a processing unit adapted to subject the predetermined film to predetermined processing; and a controller that controls said substrate processing apparatus;

wherein said controller calculates a relationship between a plurality of inputted current values and measured values obtained by carrying out, at each of the plurality of inputted current values, measurement of a change rate of a specification value of the predetermined film upon carrying out the electron beam irradiation onto the predetermined film from one of said electron beam irradiating units and the predetermined processing by said processing unit, while changing a current value inputted to said one of said electron beam irradiating units between the plurality of inputted current values, calculates through simulation an inputted current-related value for when the electron beams are irradiated from said plurality of electron beam irradiating units, and converts the inputted current-related value calculated through the simulation into a change rate of the specification value of the predetermined film based on the relationship.

9. A substrate processing system as claimed in claim 8, wherein said controller adjusts an intensity of the electron beam irradiated from each of said electron beam irradiating units based on the change rate of the specification value of the predetermined film obtained through the conversion.

10. A substrate processing system as claimed in claim 8, wherein said controller calculates a uniformity of the change rate of the specification value of the predetermined film obtained through the conversion over the substrate based on the change rate, and adjusts an intensity of the electron beam irradiated from each of said electron beam irradiating units based on the calculated uniformity of the change rate.

* * * * *